(12) United States Patent
Ong

(10) Patent No.: US 10,803,918 B2
(45) Date of Patent: Oct. 13, 2020

(54) FERROELECTRIC MEMORY ARRAY WITH HIERARCHICAL PLATE-LINE ARCHITECTURE

(71) Applicant: AUCMOS Technologies USA, Inc., Santa Clara, CA (US)

(72) Inventor: Adrian E. Ong, Pleasanton, CA (US)

(73) Assignee: AUCMOS TECHNOLOGIES USA, INC., Santa Clara, CA (US)

( * ) Notice: Subject to any disclaimer, the term of this patent is extended or adjusted under 35 U.S.C. 154(b) by 0 days.

(21) Appl. No.: 15/984,187

(22) Filed: May 18, 2018

(65) Prior Publication Data

US 2019/0355404 A1    Nov. 21, 2019

(51) Int. Cl.
   *G11C 11/22*       (2006.01)
   *H01L 27/11507*    (2017.01)
   *H01L 23/528*      (2006.01)
   *H01L 27/092*      (2006.01)

(52) U.S. Cl.
   CPC ........ *G11C 11/221* (2013.01); *H01L 23/5286* (2013.01); *H01L 27/092* (2013.01); *H01L 27/11507* (2013.01); *G11C 11/2275* (2013.01)

(58) Field of Classification Search
   CPC ............... G11C 11/221; G11C 11/2275; H01L 23/5286; H01L 27/072; H01L 27/11507
   See application file for complete search history.

(56) References Cited

U.S. PATENT DOCUMENTS

| | | | | |
|---|---|---|---|---|
| 2005/0122764 A1* | 6/2005 | Takashima | ............... | G11C 11/22 365/145 |
| 2005/0152172 A1* | 7/2005 | Jeong | ...................... | G11C 11/22 365/145 |
| 2005/0226028 A1* | 10/2005 | Takahashi | ............... | G11C 11/22 365/145 |
| 2005/0286289 A1* | 12/2005 | Watanabe | ............... | G11C 11/22 365/145 |
| 2006/0092750 A1* | 5/2006 | Jeon | ........................ | G11C 8/08 365/230.06 |

(Continued)

*Primary Examiner* — Toan K Le
(74) *Attorney, Agent, or Firm* — Edward C. Kwok; VLP Law Group, LLP

(57) ABSTRACT

A plate line segment selector circuit, coupled to a plate line segment, a plate line and a word line, may include (a) a P-channel transistor having a gate terminal connected to the plate line, a source terminal connected to the word line, and a drain terminal connected to the plate line segment; and (b) a N-channel transistor having a gate terminal connected to the plate line, a drain terminal connected to the plate line, and a source terminal connected to a ground reference voltage source. Alternatively, the plate line segment selector circuit may include: (a) a P-channel transistor having a gate terminal connected to the plate line, a source terminal connected to a predetermined voltage source, and a drain terminal; (b) a N-channel transistor having a gate terminal connected to the plate line, a source terminal connected to a ground reference voltage source, and a drain terminal; and (c) a field effect transistor having a gate terminal connected to the word line, a first drain or source terminal connected to the drain terminals of the P-channel and N-channel transistors and a second drain or source terminal connected to the plate line segment.

2 Claims, 10 Drawing Sheets

(56) References Cited

U.S. PATENT DOCUMENTS

| | | | |
|---|---|---|---|
| 2006/0107095 A1* | 5/2006 | Fong | G11C 29/50 |
| | | | 714/5.11 |
| 2007/0132557 A1* | 6/2007 | Kang | G06K 19/0701 |
| | | | 340/10.34 |
| 2007/0139993 A1* | 6/2007 | Yamamura | G11C 11/22 |
| | | | 365/145 |
| 2009/0059647 A1* | 3/2009 | Hoya | G06F 11/1008 |
| | | | 365/145 |
| 2016/0111138 A1* | 4/2016 | Izumi | G11C 11/2259 |
| | | | 365/65 |
| 2018/0122451 A1* | 5/2018 | Yan | G11C 11/2255 |

\* cited by examiner

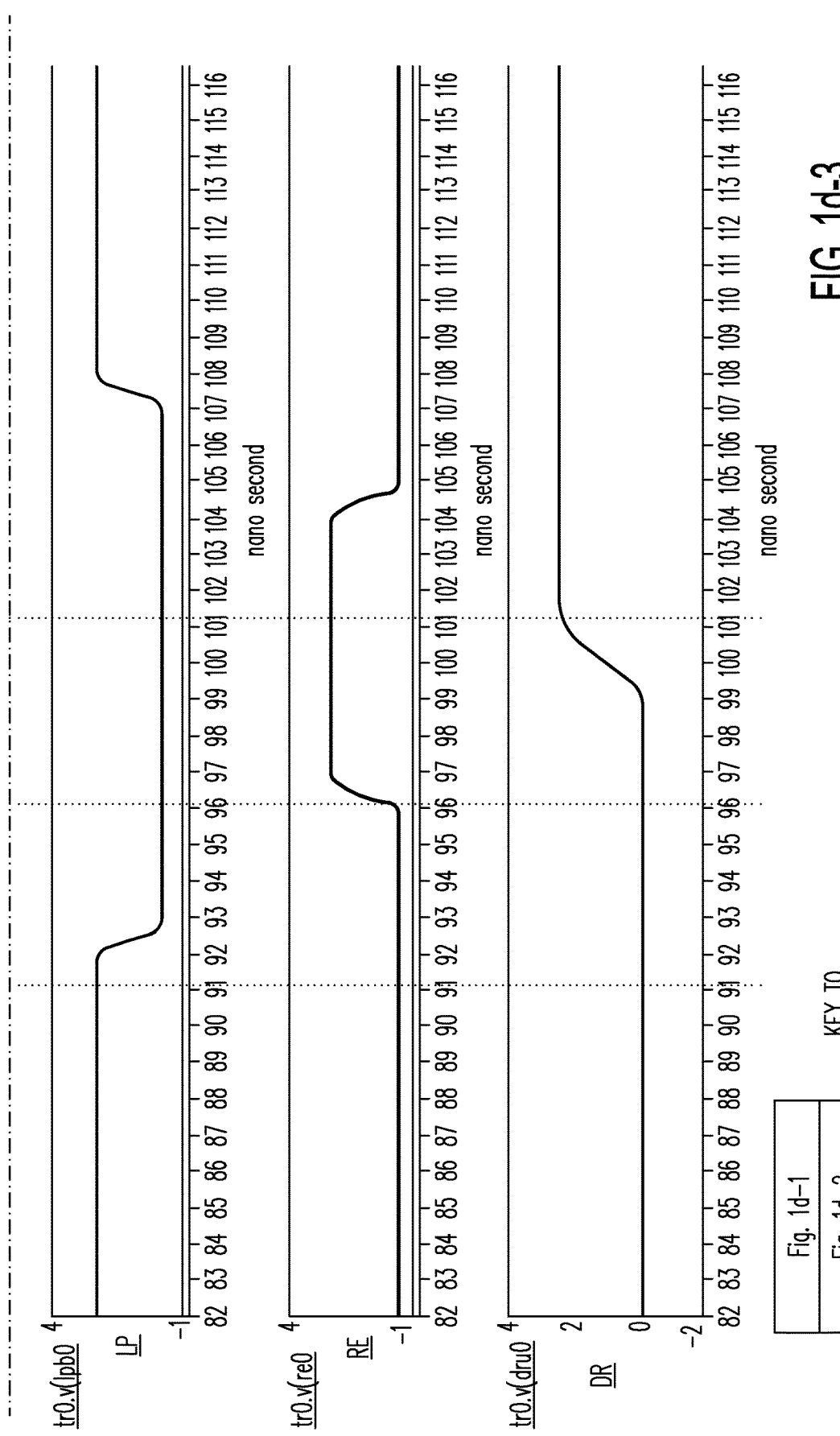

FERROELECTRIC MEMORY ARRAY WITH HIERARCHICAL PLATE-LINE ARCHITECTURE

BACKGROUND OF THE INVENTION

1. Field of the Invention

The present invention relates to ferroelectric memory circuits. In particular, the present invention relates to high-density ferroelectric memory arrays requiring high read and write operation speeds.

2. Discussion of the Related Art

Ferroelectric memory arrays with segmented plate lines allow a reliable distribution of plate-line voltages, which provides both noise immunity and desirable speed in device operations. FIG. 1a shows schematically memory array 100 in the prior art having 1T1C cells supplied by a system of segmented plate lines. The building block memory cells of memory array 100 are known as 1T1C cells, as each cell consists of a single field effect transistor and a single ferroelectric capacitor. As shown in FIG. 1a, memory array 100 includes j rows and m columns of memory cells 107-1-1 to 107-1-m, 107-2-1 to 107-2-m . . . , 107-j-1 to 107-j-m, accessible by j word lines 104-1 to 104-j each serving one row of memory cells. In addition, memory cell 100 is served by j plate line segments 103-1 to 103-j, each of which may be connected to global plate line 105 by one the word lines. Data may be written or read from bit lines 109-1 to 109-m, each serving a column of memory cells. As shown in FIG. 1a, memory array 100 include n columns of data cells and (m-n) columns of reference memory cells. Each bit line serving a column of data cells is coupled to one of sense amplifier circuits 101-1 to 101-n. Each bit line serving a column of reference memory cells are coupled one of reference signal generator 102-1 to 102-(m-n).

As shown in FIG. 1a, each memory cell includes a connected ferroelectric capacitor and a field effect transistor connected in series between a corresponding plate line segment and a corresponding bit line. A corresponding word line is activated when the memory cell is selected. The activated word turns on the field effect transistor of the selected cell to connect the ferroelectric capacitor of the selected memory cell to the corresponding bit line. At the same time, the activated word line also turns on a corresponding one of plate line segment select transistors 108-1 to 108-j, which activates the corresponding plate line segment.

As is known to those of ordinary skill the art, a binary data value is stored as "charge" in the ferroelectric capacitor of the ferroelectric memory cell. The reading and writing of such a binary value from and to such a ferroelectric memory cell is also well-known to those of ordinary skill in the art. It is worth mentioning that, reading of a ferroelectric memory cell in one of the two binary states may be destructive. By convention, the state that is vulnerable to a destructive read is assigned logic value '1.' To read a memory cell, the plate-line is driven high and the bit-line is sensed. Driving the plate line high writes a logic value "0" into the memory cell. To preserve the state of the ferroelectric memory cell being read, a write operation is required to restore the state lost to the reading operation.

FIG. 1b shows schematically memory array 200 in the prior art having 2T2C cells supplied by a system of segmented plate lines. As shown in FIG. 1b, memory array 200 is organized m sections of memory cells, with each section having j rows and n columns of memory cells served by j plate line segments of that section. For example, the memory cells of the i-th section are served by plate line segments 103-i-1 to 103-i-j. In FIG. 1b, j word lines serve the n rows of memory cells in all sections. Unlike memory array 100, each memory cell in memory array 200 includes two 1T1C cells, to allow a binary value to be stored in complement states. Reading and writing operation from and into a memory cell are achieved using corresponding true and complement bit lines. For example, memory cell 207-1-1 in FIG. 2a is accessed via true and complement bit lines 109-1t and 109-1c.

FIG. 1c shows an exemplary sense amplifier 250 suitable for use with memory array 200 of FIG. 1b. FIG. 1d shows the associated waveforms of sense amplifier 250 during a read operation. As shown in FIG. 1c, sense amplifier 250 include an equalization circuit 251, data latch 252 and input/output circuit 253. As shown in FIG. 1d, initially or the during a quiescent state (i.e., prior to time to), signal EQ is asserted, so that both true and complement bit lines BLT and BLC are forced to a ground voltage value. When a read operation is initiated at time $t_0$, (i) signal EQ is de-asserted to disconnect equalizer circuit 251 from bit lines BLC and BLT, (ii) the corresponding word line WL is activated, (iii) signal PL on the corresponding plate line segment is driven to its operational value, and (iv) signals LNB and LPB enables latch circuit 252 by connecting latch circuit 252 to power and ground voltage sources. Between times $t_0$ and $t_1$, the memory cell drives the stored complement binary value onto true and complement bit lines BLC and BLT. At time $t_1$, after the signal across bit lines BLT and BLC has settled, the stored complement binary value has also settled in latch circuit 252. As discussed above, a read operation on a ferroelectric capacitor is destructive to one of the two binary states. Latch circuit 252 allows the complement binary value latched to be written back into the memory cell. At time $t_1$, signal CSEL is asserted to enable input/output circuit 253 to output the complement binary value read to a circuit external to memory array 200. Data read signal DR develops after CSEL is asserted. At time $t_2$, signal PL of the corresponding line segment returns to its quiescent value to write back the complement binary value into the memory cell.

SUMMARY

According to one embodiment of the present invention, a memory array may be provided plate line segment selector circuits each coupled to a plate line segment, a plate line and a word line. The plate line segment selector circuit may include (a) a P-channel transistor having a gate terminal connected to the plate line, a source terminal connected to the word line, and a drain terminal connected to the plate line segment; and (b) a N-channel transistor having a gate terminal connected to the plate line, a drain terminal connected to the plate line, and a source terminal connected to a ground reference voltage source.

In another embodiment, the plate line segment selector circuit may include: (a) a P-channel transistor having a gate terminal connected to the plate line, a source terminal connected to a predetermined voltage source, and a drain terminal; (b) a N-channel transistor having a gate terminal connected to the plate line, a source terminal connected to a ground reference voltage source, and a drain terminal; and (c) a field effect transistor having a gate terminal connected to the word line, a first drain or source terminal connected to the drain terminals of the P-channel and N-channel transistors and a second drain or source terminal connected to the plate line segment.

The plate line segment selector circuit may be incorporated into a ferroelectric memory circuit organized into memory arrays, in which each memory array is organized into rows each served by a word line and a plate line segment.

The present invention is better understood upon consideration of the detailed description below in conjunction with the accompanying drawings.

BRIEF DESCRIPTION OF THE DRAWINGS

FIG. 1d-1 through FIG. 1d-3 show associated waveforms of signals in sense amplifier 250 during a read operation.

To facilitate cross reference across the figures, like elements in the figures are assigned like reference numerals.

DETAILED DESCRIPTION OF THE PREFERRED EMBODIMENTS

Figure 1A:
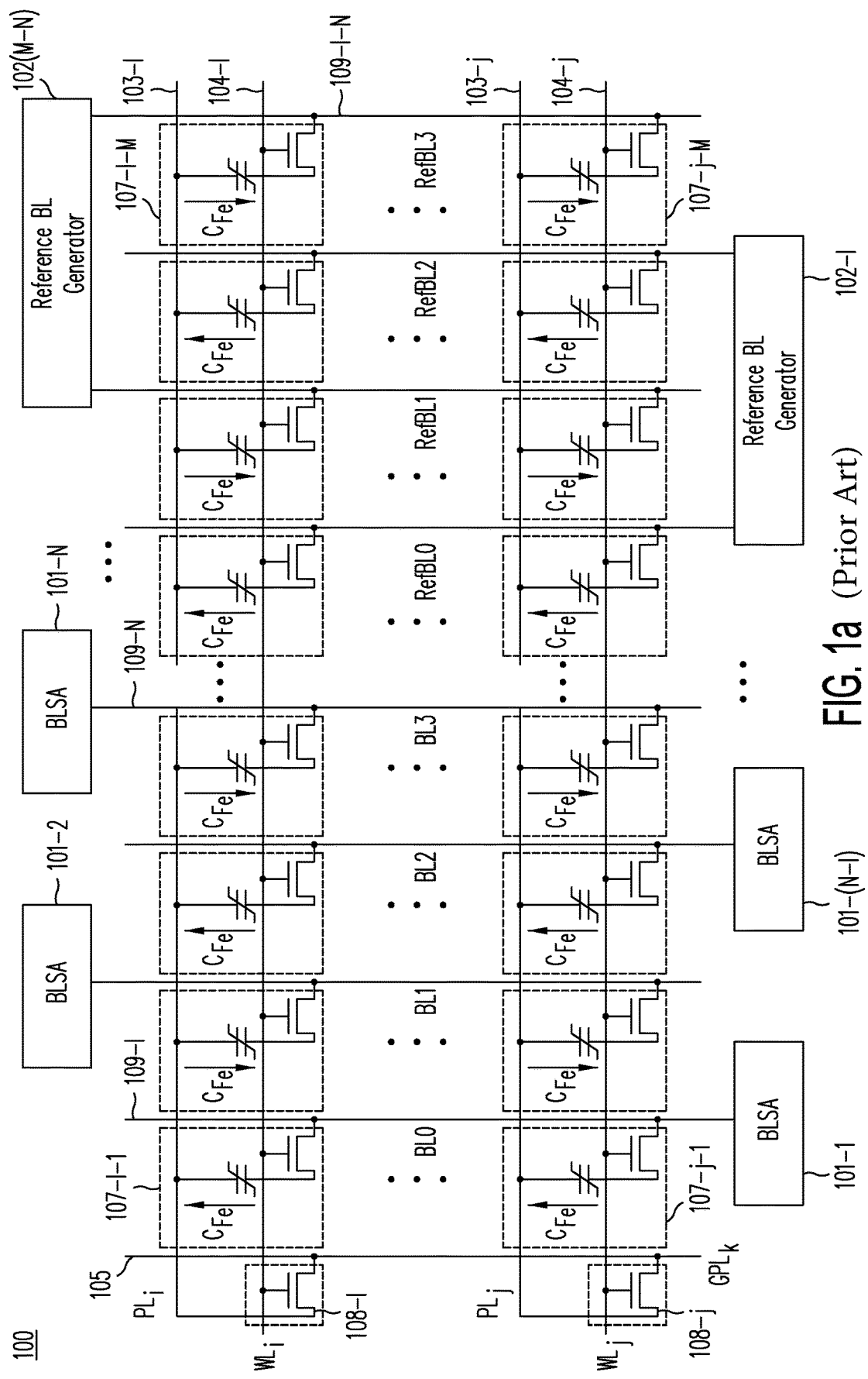
FIG. 1a shows schematically memory array 100 in the prior art having 1T1C cells supplied by a system of segmented plate lines.
Figure 1B:
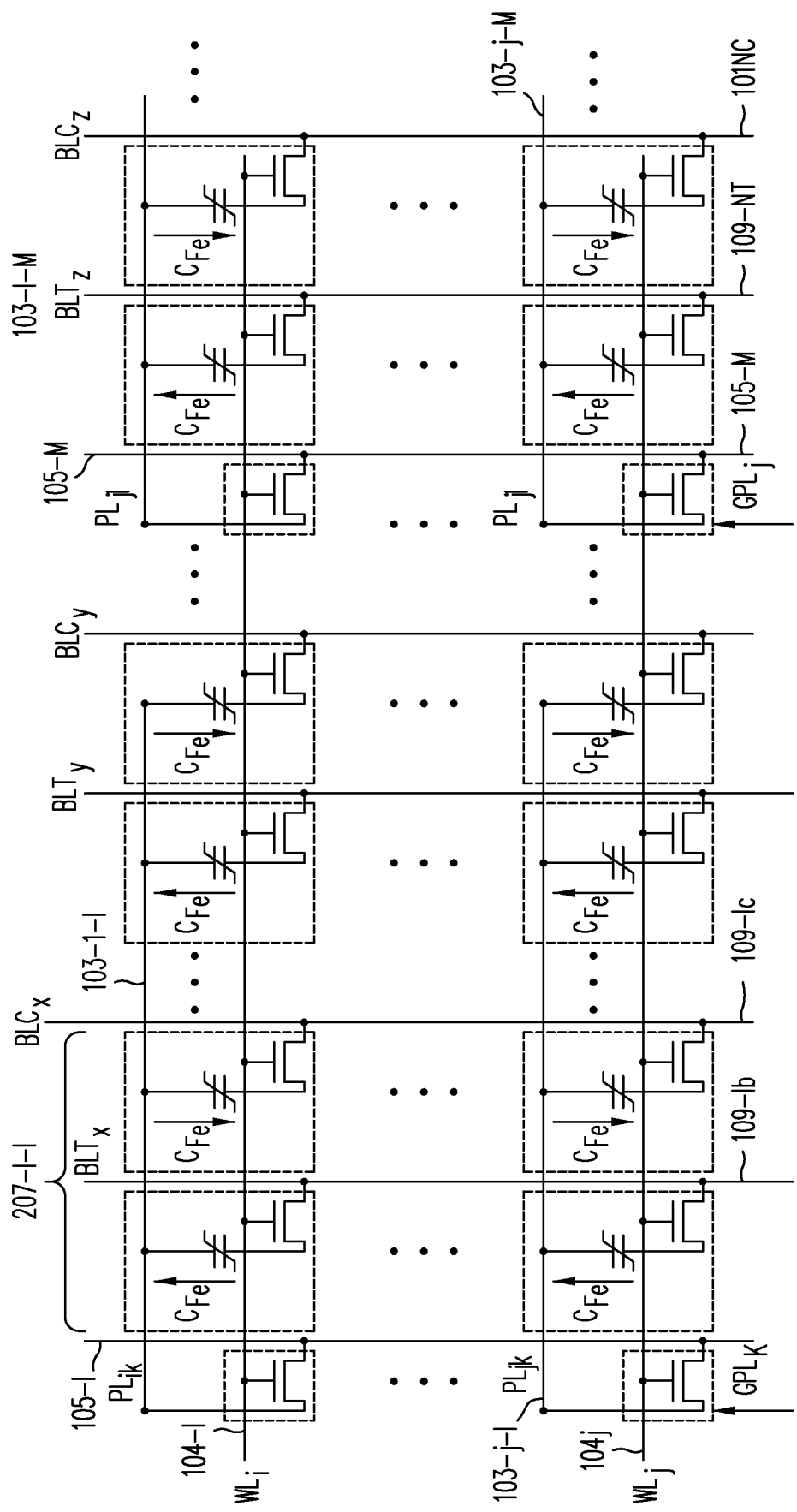
FIG. 1b shows schematically memory array 200 in the prior art having 2T2C cells supplied by a system of segmented plate lines.
Figure 2A:
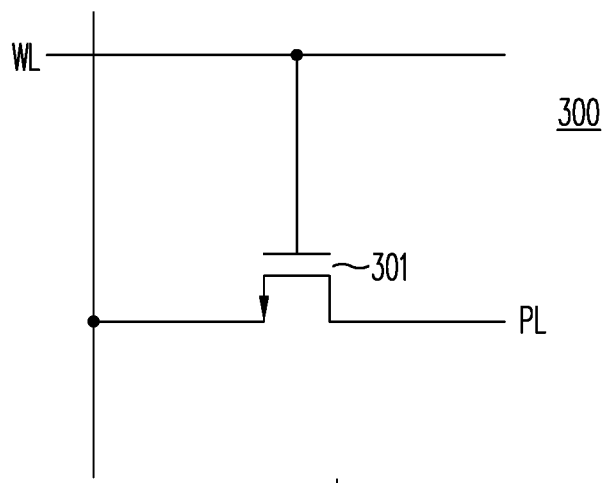
FIG. 2a shows in greater detail plate line segment select transistor 300.

Both memory arrays 100 and 200 of FIGS. 1a and 1b show a plate line segment selector that include a plate line transistor (e.g., plate line segment select transistor 109-1 of FIG. 1a) which energizes a corresponding plate line segment based on an activation of a corresponding bit line. FIG. 2a shows in greater detail plate line segment selector 300. As shown in FIG. 2a, plate line segment selector 300 includes global plate line GPL, word line WL and field effect transistor 301. When signal WL is provided a voltage that exceeds the voltage on global plate line GPL by at least the threshold voltage of field effect transistor 301, the associated plate line segment PL is driven to the voltage on global bit line GPL. Plate line segment selector 300 has the disadvantage that the voltage on word line WL has to be at least a threshold voltage higher than global plate line GPL. Also, for a high-density memory array without a sufficiently large driver for the global bit line, the total capacitance of the ferroelectric capacitors in a row of memory cells is a sufficiently large load on global plate line GPL, such that the voltage on plate line segment PL rises slowly. Thus, plate line selector 300 is not suitable for high-speed memory operations.

Figure 2B:
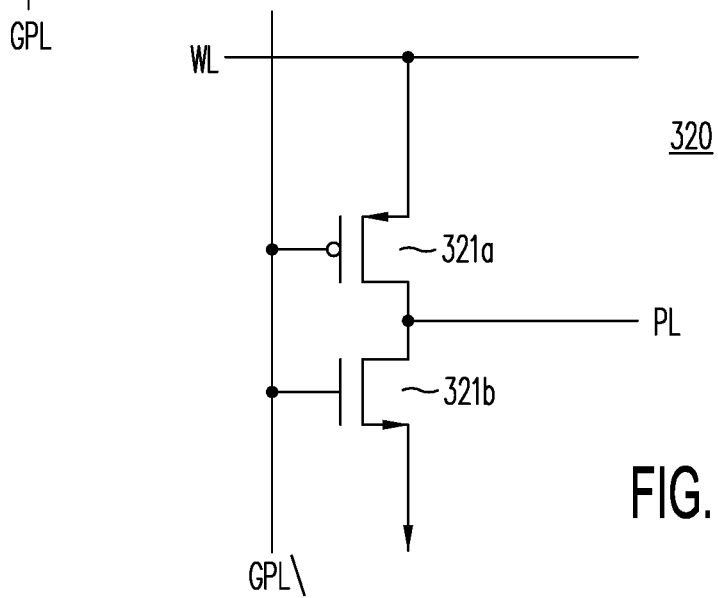
FIG. 2b shows a first improved plate line segment selector 320, in accordance with one embodiment of the present invention.

FIG. 2b shows plate line segment selector 320, in accordance with one embodiment of the present invention. As shown in FIG. 2b, instead of field effect transistor 301, plate line segment selector 320 includes buffer circuit 321 formed by P-channel field effect transistor 321a and N-channel transistor 321b. The source terminal of P-channel transistor 321a is connected to word line WL, while both gate terminals of P-channel transistor 321a and N-channel transistor 321b are connected to global plate line GPL, In this configuration, when the voltage on global plate line GPL goes to the ground reference voltage, P-channel transistor 321a is turned on, so that plate line segment PL is driven to the voltage on word line WL. During read or write operations, word line WL is activated prior to global plate line GPL is driven to the ground reference voltage. In this configuration, the load on the voltage on global plate line GPL is merely the total capacitance on the gate terminals of P-channel transistor 321a and N-channel transistor 321b. The voltage on word line WL need not be above the voltage on plate line segment PL; however, the total capacitance on the plate line segment PL now falls on word line WL.

Figure 2C:
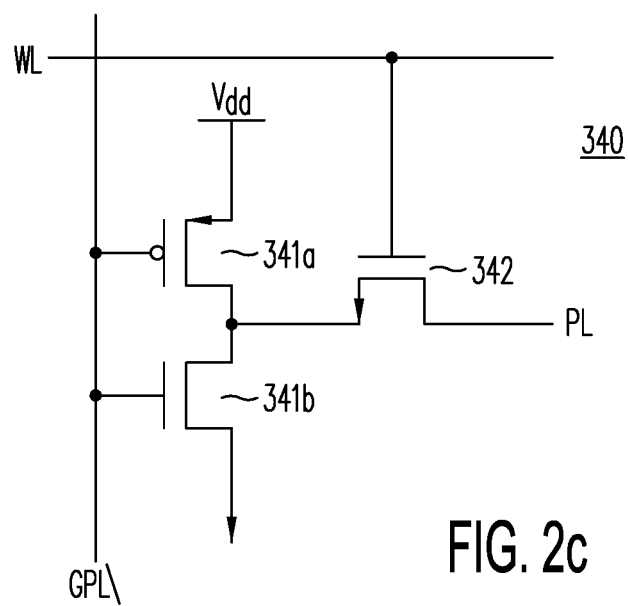
FIG. 2c shows a second improved plate line segment selector 340, in accordance with one embodiment of the present invention.

FIG. 2c shows plate line segment selector 340, in accordance with one embodiment of the present invention. As shown in FIG. 2c, plate line segment selector 340 includes (i) driver circuit 341 formed by P-channel transistor 341a and N-channel transistor 341b, and (ii) field effect transistor 342. However, unlike plate line segment 320 of FIG. 2b, the source terminal of P-channel transistor 341a of plate line segment selector 340 is connected to voltage source Vdd, Driver circuit 341 drives the load on plate line segment PL through field effect transistor 342, which is controlled by word line WL. In this configuration, while word line WL needs to be driven to a voltage above voltage source Vdd by at least the threshold voltage of field effect transistor 342, driver circuit 341 ensures that a rapid rise time for the voltage segment PL. Thus, plate line segment selector 340 is suitable for use in high-speed memory operations.

Figure 1C:
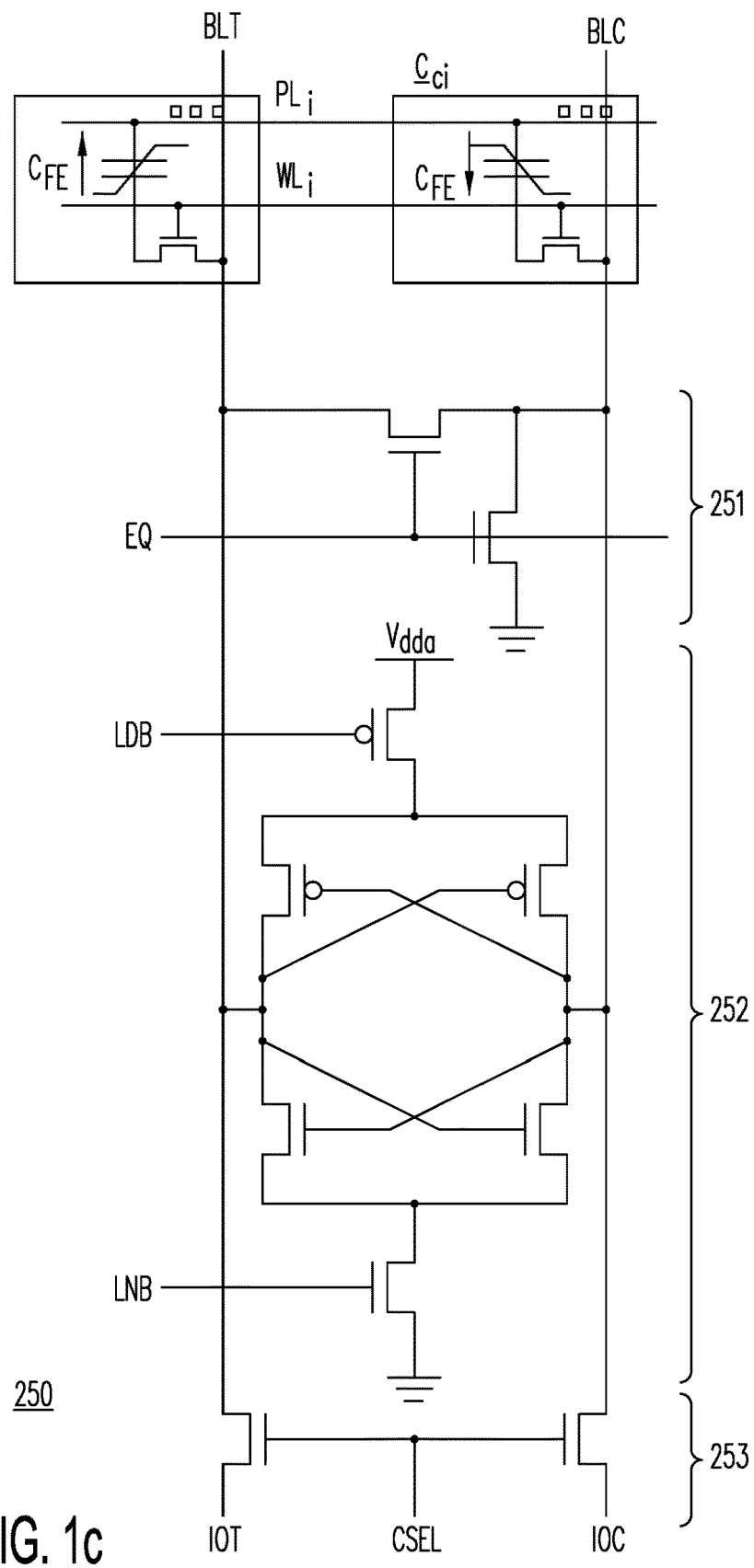
FIG. 1c shows an exemplary sense amplifier 250 suitable for use with memory array 200 of FIG. 1b.
Figures 1, 1D:
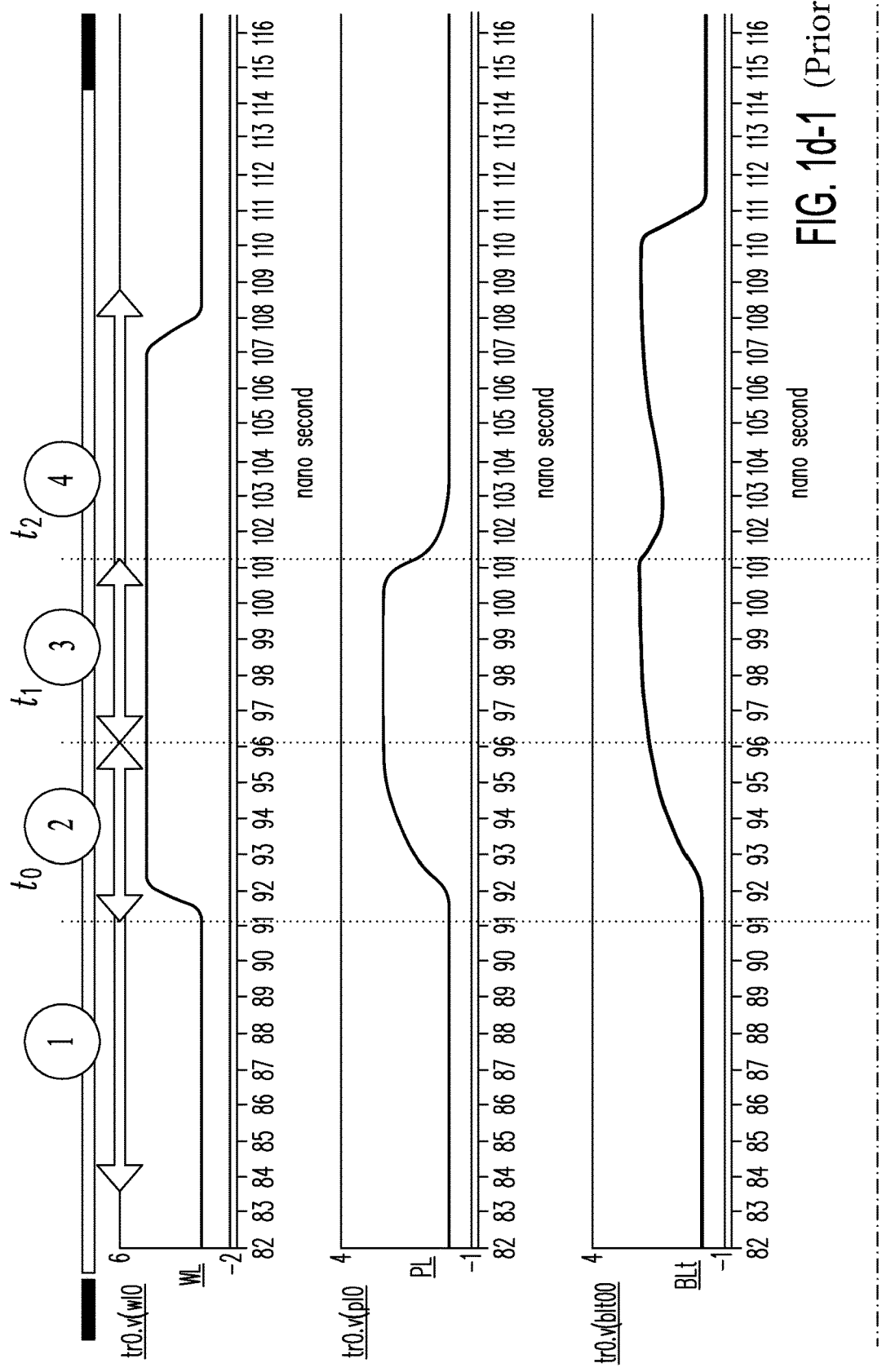
Figures 1, 1D, 2:
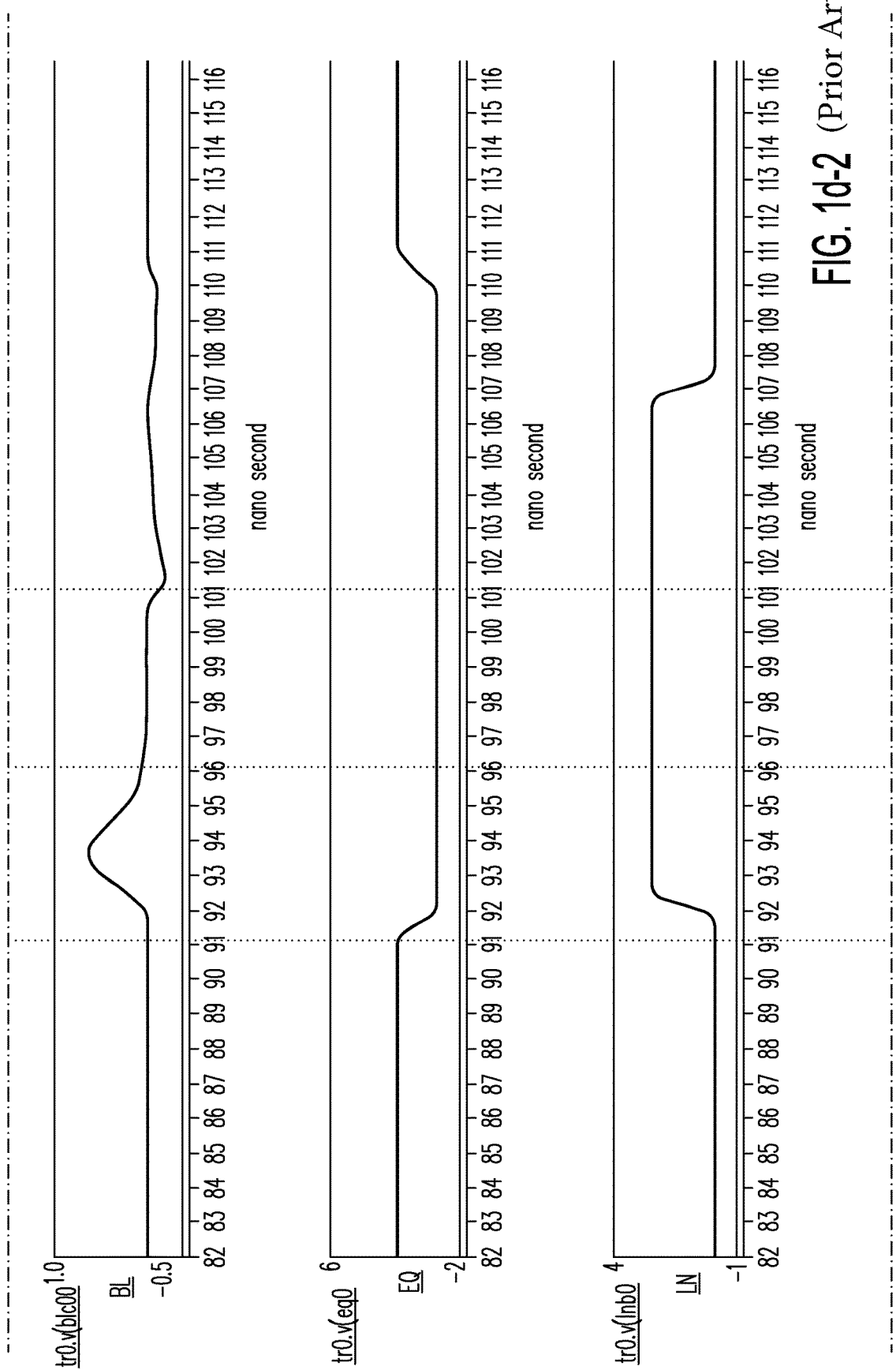
Figure 3A:
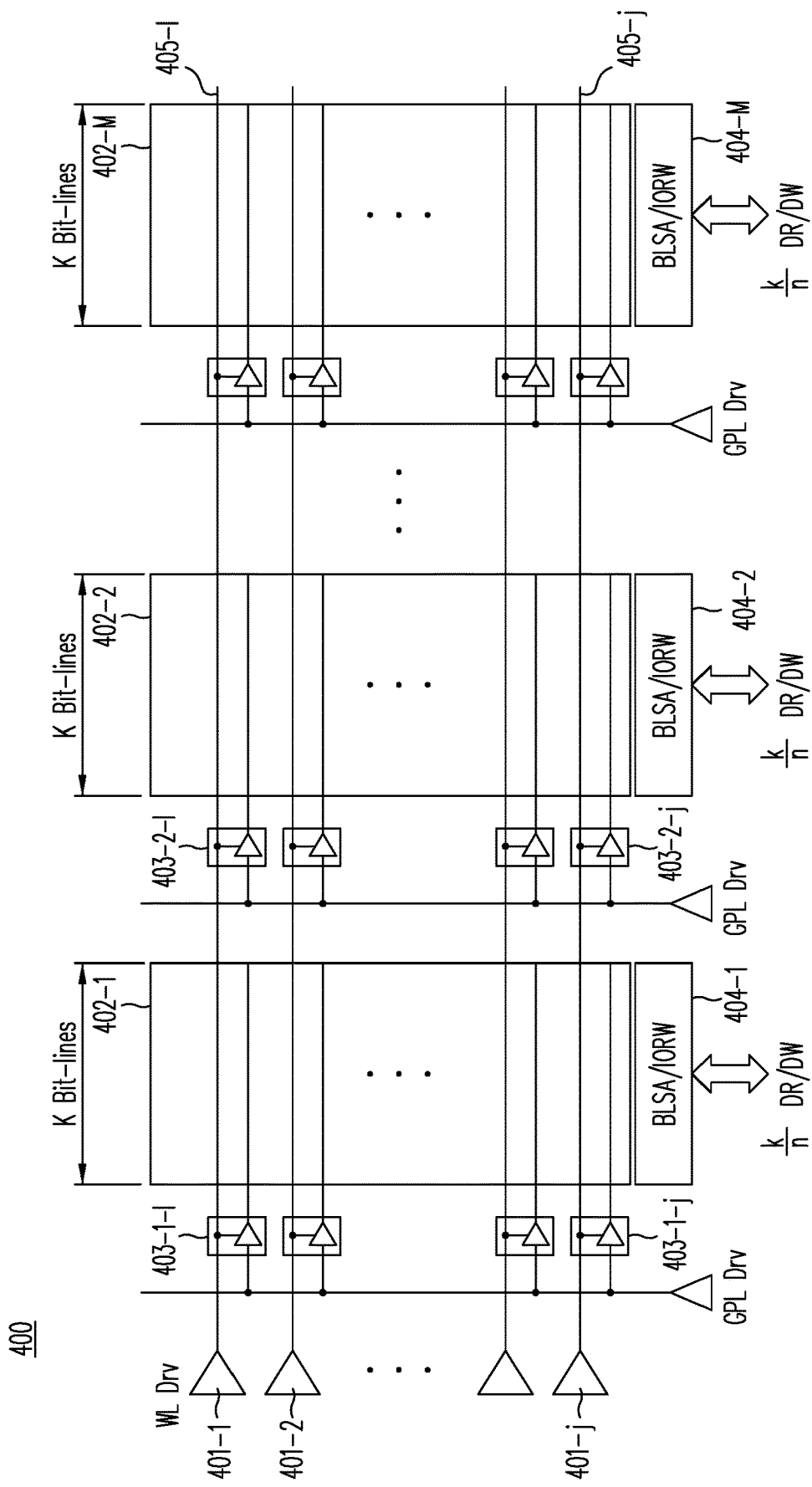
FIG. 3a shows memory array 400 using the plate line segment selectors of the present invention.

FIG. 3a shows memory array 400 using the plate line segment selectors of the present invention. As shown in FIG. 3a, memory array 400 includes m memory array sections 402-1, . . . , 402-m, each having j rows of memory cells. Memory array sections 402-1, . . . , 402-m are served by j word lines 405-1 to 405-j, driven respectively by word line drivers 401-1 to 401-j. In addition, each memory array section is served by a local plate line segment selected by j plate line segment selectors (e.g., plate line segment selectors 403-1-1 to 403-1-j for memory array segment 402-1). These plate line segment selectors may each be implemented by either plate line segment selector 320 or plate line segment selector 340 of FIGS. 2a and 2b. Each memory array section also includes a corresponding sense amplifier circuit and input/output circuit. These sense amplifier and input/output circuit may be implemented using conventional circuitry such as those shown in FIG. 1c. Each memory cell of memory array 400 may be any ferroelectric memory cell, such as the 1T1C memory cell of FIG. 1a, or the 2T2C memory cell of FIG. 1b. Conventional read operations (e.g., the read operation illustrated by FIG. 1d) may be implemented in memory array 400.

Figure 3B:
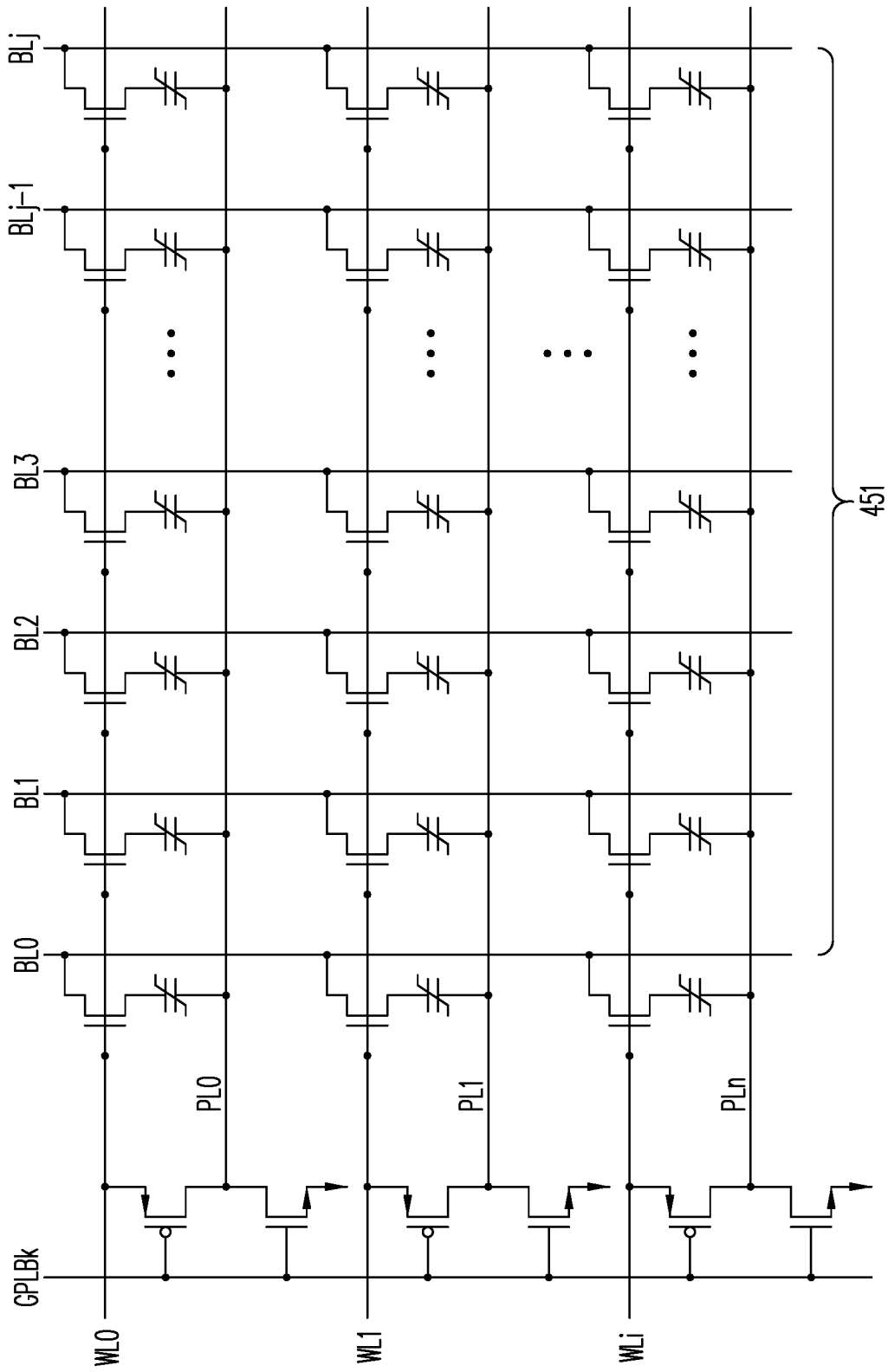
FIG. 3b shows implementation 450 of a memory array section of memory array 400 of FIG. 3a, in accordance with one embodiment of the present invention.

FIG. 3b shows implementation 450 of a memory array section of memory array 400 of FIG. 3a, in accordance with one embodiment of the present invention. As shown in FIG. 3b, implementation 450 uses plate line selector 320 of FIG.

2a. The memory cells in memory cell array 451 may be organized in 1T1C configuration or 2T2C configuration.

Figure 3C:
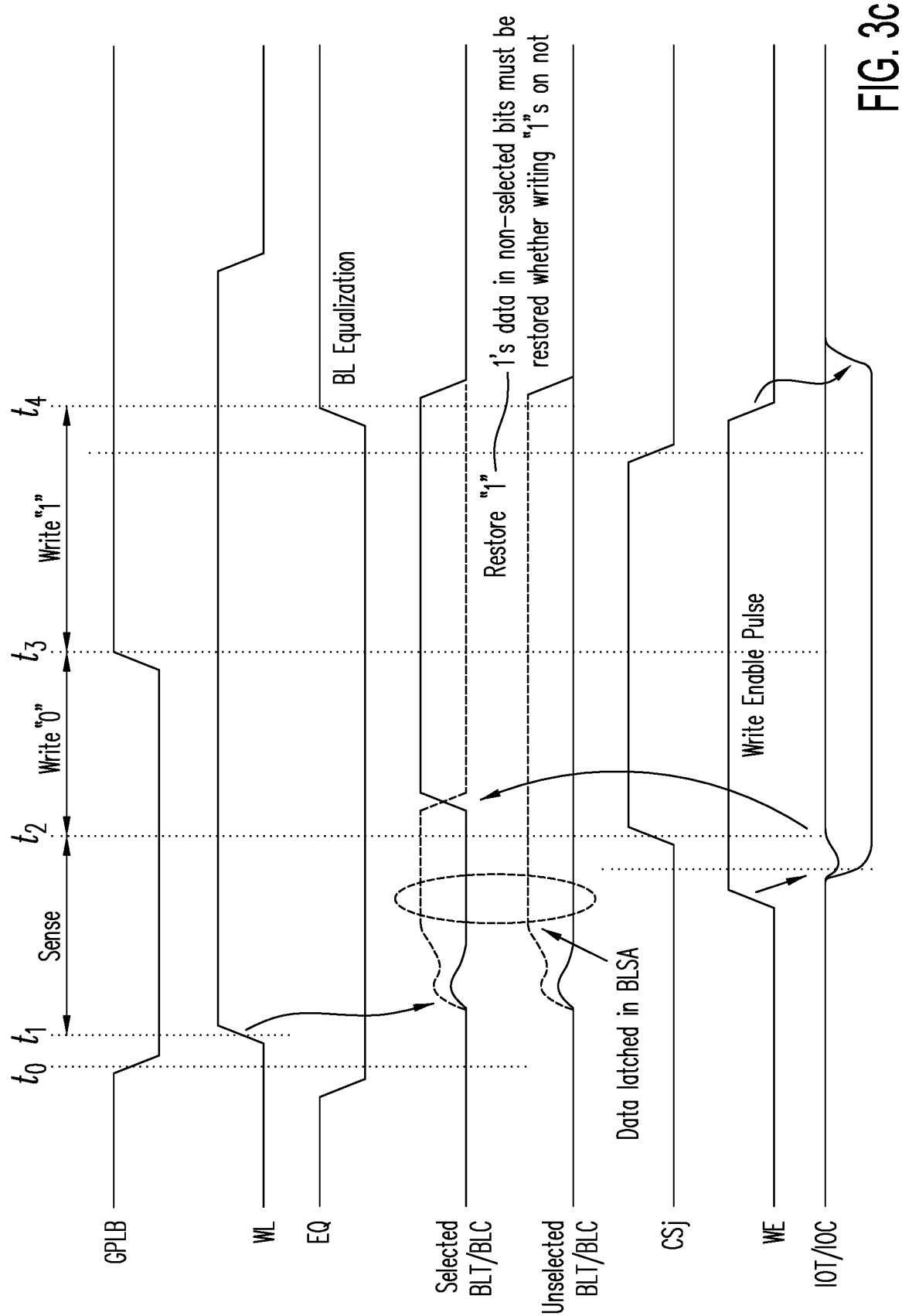
FIG. 3c illustrate a write operation in memory array 400, in accordance with one embodiment of the present invention.

FIG. 3c illustrate a write operation in memory array 400, in accordance with one embodiment of the present invention. In FIG. 3c, for purpose of this example only, the memory array is organized such that each memory cell is accessed by a true and complement bit lines. As shown in FIG. 3c, just prior to time $t_0$, signal EQ is de-asserted to release the true and complement bit lines from their driven equalized voltage (e.g., a ground reference voltage). At time $t_0$, the control signal on global bit line GPLB goes to a low voltage in preparation for the write operation. At time $t_1$, word line signal WL is activated, resulting in all plate line segments associated with word line WL being brought to its operational voltage (e.g., the voltage of word line GPLB in the case of plate line segment selector 320, or voltage Vdd, in the case of plate line selector circuit 320). The stored binary values in the ferroelectric capacitors of the memory cells activated by word line WL appear on their associated true and complement bit lines, settling between times $t_1$ and $t_2$. These binary values are latched into the latch circuits in the sense amplifiers. Shortly before time $t_2$, write enable signal WE (or RE, read enable; not shown) allows data-in (or data-out) to be put onto the true and complement input/output bus (IOTIOC) of the selected memory cell to receive the binary value to be written into the memory cell. At time $t_2$, control signal CSL is asserted, so that the binary value to be written into the selected memory cell is driven onto true and complement bit lines BLT and BLC. At this time, the voltage on the associated plate line segment of the selected memory cell allows a binary logic value '0' to be written into the memory cell. At time $t_3$, global bit line GPLB returns to its quiescent voltage which, together with the voltage on activated word line WL, allows a binary logic value '1' to be written in to the memory cell. For the unselected memory cells, any loss of logic '1' data resulting from a destructive read during times $t_1$ and $t_2$ are also restored by a restorative write-back. At time $t_4$, write enable signal WE is deasserted, which completes the write operation. About this time, signals CSL, WL and EQ return to their quiescent voltages.

The detailed description above is provided to illustrate specific embodiments of the present invention and is not intended to be limiting. Numerous variations and modifications within the scope of the present invention are possible. The present invention is set forth in the accompanying claims.

I claim:

1. A ferroelectric memory circuit, comprising:
   one or more arrays of memory cells, each array being organized into a plurality of rows and a plurality of columns;
   a plurality of groups of bit lines, wherein each group encompasses bit lines associated with multiple adjacent columns, and each bit line in each group is coupled to memory cells of a different one of the group's associated adjacent columns;
   a plurality of word lines, each providing a control signal to an associated rows of memory cells in one or more of the memory arrays;
   a plurality of plate lines, each plate line serving memory cells of a different one of the groups of bit lines;
   a plurality of plate line segments each providing a voltage to an associated row of memory cells in an associated array; and
   a plurality of plate line segment selector circuits each coupled to an associated plate line segment, an associated plate line and an associated word line, each plate line segment selector circuit comprising:
   a P-channel transistor having a gate terminal connected to the associated plate line, a source terminal connected to the associated word line, and a drain terminal connected to the associated plate line segment; and
   a N-channel transistor having a gate terminal connected to the associated plate line, a drain terminal connected to the associated plate line segment, and a source terminal connected to a ground reference voltage source.

2. A ferroelectric memory circuit as in claim 1, further comprising a plurality of groups of sense amplifier circuits, each group of sense amplifier serving memory cells associated with a different one of the groups of bit lines.

* * * * *